(12) United States Patent  (10) Patent No.: US 7,893,456 B1
Nemati et al.  (45) Date of Patent: Feb. 22, 2011

(54) THYRISTOR-BASED MEMORY AND ITS METHOD OF OPERATION

(75) Inventors: Farid Nemati, Menlo Park, CA (US); Kevin J. Yang, Santa Clara, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 0 days.

(21) Appl. No.: 12/368,226

(22) Filed: Feb. 9, 2009

Related U.S. Application Data

(60) Continuation of application No. 11/487,548, filed on Jul. 15, 2006, now Pat. No. 7,488,627, which is a division of application No. 10/741,539, filed on Dec. 19, 2003, now Pat. No. 7,078,739, which is a continuation-in-part of application No. 10/706,162, filed on Nov. 12, 2003, now Pat. No. 7,304,327.

(51) Int. Cl.
*H01L 29/74* (2006.01)
*H01L 31/111* (2006.01)

(52) U.S. Cl. .................. 257/107; 257/162; 257/180; 438/133; 438/136

(58) Field of Classification Search .............. 257/107, 257/162, 180; 438/133, 136, 139, 140
See application file for complete search history.

(56) References Cited

U.S. PATENT DOCUMENTS

| | | | |
|---|---|---|---|
| 3,812,405 A | 5/1974 | Clark | |
| 4,210,827 A | 7/1980 | Kanazawa et al. | 327/306 |
| 4,480,312 A | 10/1984 | Wingate | |
| 4,829,357 A | 5/1989 | Kasahara | |
| 4,965,872 A | 10/1990 | Vasudev | |
| 5,424,563 A | 6/1995 | Temple et al. | 257/154 |
| 5,448,104 A | 9/1995 | Yallup | |
| 5,627,401 A | 5/1997 | Yallup | |
| 6,160,280 A * | 12/2000 | Bonn et al. | 257/272 |
| 6,229,161 B1 | 5/2001 | Nemati et al. | |
| 6,362,910 B1 * | 3/2002 | Tokita | 398/183 |
| 6,448,586 B1 | 9/2002 | Nemati et al. | |
| 6,462,359 B1 | 10/2002 | Nemati et al. | |
| 6,492,662 B2 | 12/2002 | Hsu et al. | |
| 6,512,274 B1 | 1/2003 | King et al. | |

(Continued)

OTHER PUBLICATIONS

Farid Nemati et al., U.S. Appl. No. 10/706,162, filed Nov. 12, 2003, "Thyrsitor Circuit and Approach for Temperature Stability," assigned to the assignee of the present application.

(Continued)

*Primary Examiner*—Phuc T Dang
(74) *Attorney, Agent, or Firm*—The Webostad Firm

(57) ABSTRACT

A thyristor-based memory may comprise a thyristor accessible via an access transistor. A temperature dependent bias may be applied to at least one of a supporting substrate and an electrode capacitively-coupled to a base region of the thyristor. The voltage level of the adaptive bias may change with respect to temperature and may influence and/or compensate an inherent bipolar gain of the thyristor in accordance with the change in bias and may enhance its performance and/or reliability over a range of operating temperature. In a particular embodiment, the thyristor may be formed in a layer of silicon of an SOI substrate and the adaptive bias coupled to a supporting substrate of the SOI structure.

5 Claims, 10 Drawing Sheets

U.S. PATENT DOCUMENTS

| | | |
|---|---|---|
| 6,528,356 B2 | 3/2003 | Nemati et al. |
| 6,545,297 B1 | 4/2003 | Noble, Jr. et al. |
| 6,552,398 B2 | 4/2003 | Hsu et al. |
| 6,583,452 B1 | 6/2003 | Cho et al. |
| 6,611,452 B1 | 8/2003 | Han |
| 6,627,924 B2 | 9/2003 | Hsu et al. |
| 6,888,176 B1 * | 5/2005 | Horch et al. ............... 257/107 |
| 6,913,955 B1 | 7/2005 | Horch et al. |

OTHER PUBLICATIONS

F. Nemati and J.D. Plummer, "A Novel High Density, Low Voltage SRAM Cell with a Vertical NDR Device," VLSI Technology Technical Digest, 1998.

F. Nemati and J.D. Plummer, "A Novel Thyristor-Based SRAM Cell (T-RAM) for High-Speed, Low-Voltage, Giga-Scale Memories", International Electronic Device Meeting Technical Digest, 1999.

National Scientific Corp., "TMOS Memory Cell, Breakthrough Technology in SRAM", at www.nsclocators.com/images/pdf/IP_tmos-2003.PDF, 2003.

R.Colin Johnson, "Hybrid Tunnel Diodes Could Leapfrog Moore's Law," EE Times, Oct. 29, 2003, also at www.eetimes.com/at/news/OEG20031029S0015.

* cited by examiner

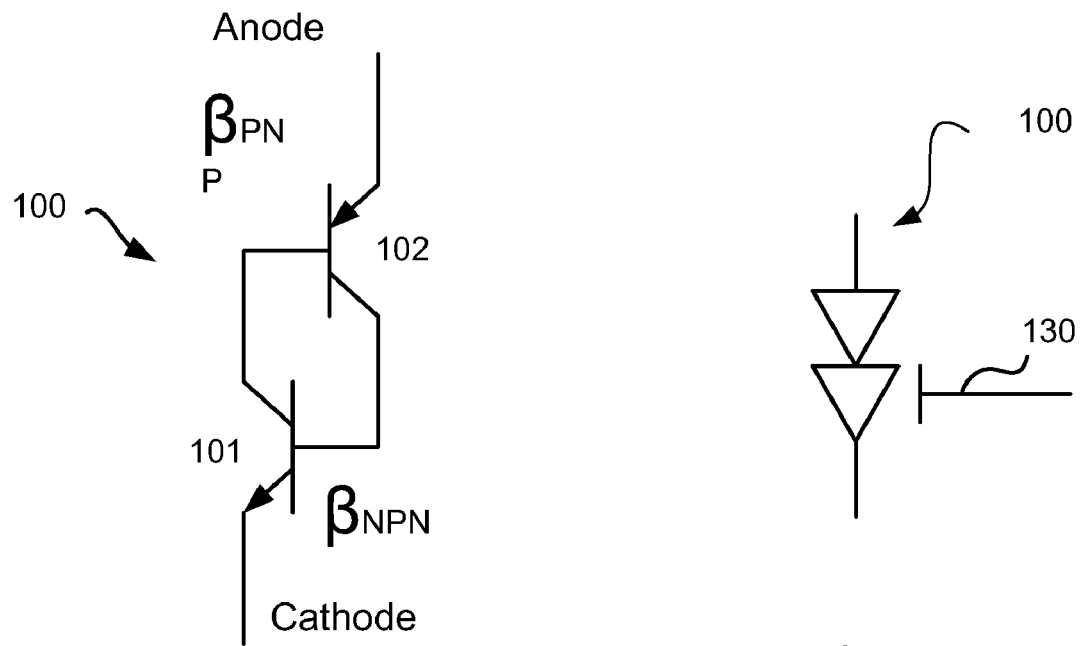
FIG. 1A
FIG. 1B
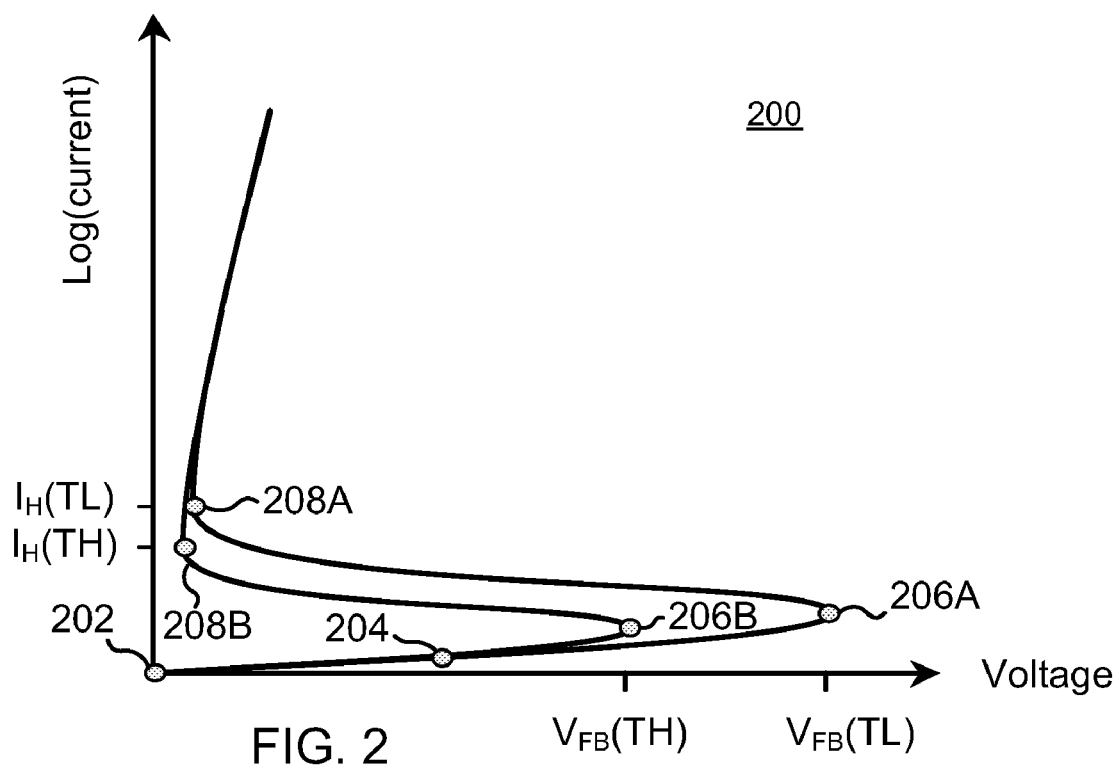
FIG. 2

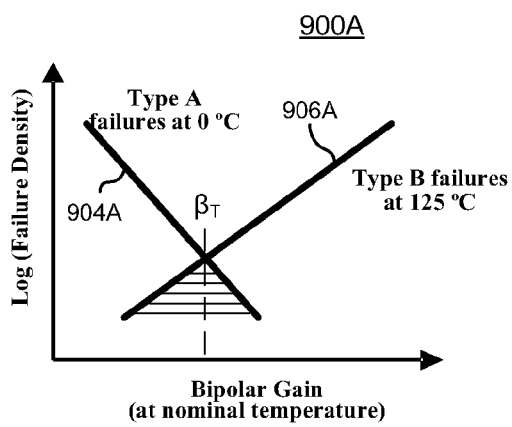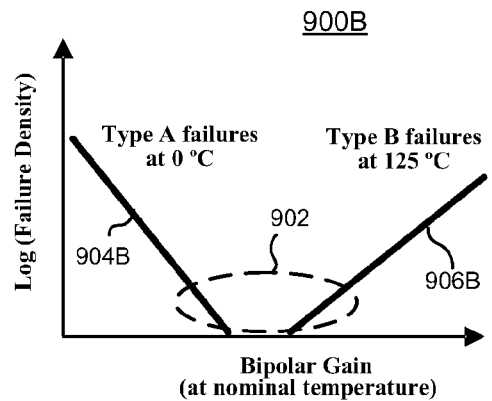
FIG. 9A
(Prior Art)
FIG. 9B

THYRISTOR-BASED MEMORY AND ITS METHOD OF OPERATION

RELATED APPLICATION(S)

This application is a continuation of U.S. patent application Ser. No. 11/487,548 filed Jul. 15, 2006, now U.S. Pat. No. 7,488,627 issued Feb. 10, 2009; which is a divisional of U.S. application Ser. No. 10/741,539 filed Dec. 19, 2003, now U.S. Pat. No. 7,078,739 issued Jul. 18, 2006; which is a continuation-in-part of U.S. patent application Ser. No. 10/706,162 filed on Nov. 12, 2003, now U.S. Pat. No. 7,304,327 issued Dec. 4, 2007, each of which is hereby incorporated by reference.

BACKGROUND

The present invention is directed to semiconductor devices and, more specifically, to thyristor-based memory.

The semiconductor industry has recently experienced technological advances that have permitted dramatic increases in integrated circuit density and complexity, and equally dramatic decreases in power consumption and package sizes. Present semiconductor technology may now permit single-die microprocessors with many millions of transistors, operating at speeds of hundreds of millions of instructions per second, to be packaged in relatively small semiconductor device packages. As the use of these devices has become more prevalent, the demand for faster operation and better reliability has increased.

An important part in the circuit design, construction, and manufacture of semiconductor devices concerns semiconductor memories; the circuitry used to store digital information. Conventional random access memory devices may include a variety of circuits, such as SRAM and DRAM circuits. SRAMs are mainly used in applications that require a high random access speed and/or a CMOS logic compatible process. DRAMs, on the other hand, are mainly used for high-density applications where the slow random access speed of DRAM can be tolerated.

Some SRAM cell designs may consist of at least two active elements, one of which may include an NDR (Negative Differential Resistance) device. Overall performance of this type of SRAM cell may be based in large part upon the properties of the NDR device. A variety of NDR devices have been introduced in various applications, which may include a simple bipolar transistor or a complicated quantum-effect device. One advantage of an NDR-based cell for an SRAM design may be its potential for allowing a cell area smaller than conventional SRAM cells (such as the 4T or 6T cells). Many of the typical NDR-based SRAM cells, however, may have deficiencies that may prohibit their use in some commercial SRAM applications. Some of these deficiencies may include: high power due to the large standby current for its data retention states; excessively high or excessively low voltage levels for cell operation; and/or sensitivity to manufacturing variations which may degrade its noise immunity; limitations in access speed; limited operability over a given temperature range and limited yield due to a variety of fabrication tolerances.

Recently, thyristors have been introduced as a type of NDR device for forming a thyristor-based memory device. These types of memory can potentially provide the speed of conventional SRAM but with the density of DRAM and within a CMOS compatible process. Typically, such thyristor-based memory may comprise a thin capacitively coupled thyristor ("TCCT") to form a bi-stable element for an SRAM cell. For more details for specific examples of this new device, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Intl Publication No. WO 99/63598, corresponding to U.S. patent application Ser. No. 09/092,449, now U.S. Pat. No. 6,229,161. Each of these documents is hereby incorporated by reference in its entirety.

An important design consideration in any type of thyristor-based memory cell, including the TCCT-based RAM cell, is the holding current of the thyristor. Ideally, the holding current of the thyristor may be designed for a low nominal level for low power while maintaining a stable conducting state for data retention.

Another important consideration of a thyristor-based memory cell is its blocking state. Ideally, the thyristor may be immune to various environmental conditions such as temperature. By such immunity, the thyristor may obtain improved data reliability over temperature.

Further, during manufacture of semiconductor memory, various processes—i.e., such as doping, implant, activation and anneal procedures to name a few—have tolerances or variation, which in turn may impact performance of the device. Accordingly, these variations may impact holding current and/or the blocking level of the thyristor, and, at the same time, affect its reliability for data retention.

SUMMARY

According to an embodiment of the present invention, a thyristor-based memory may provide stable operation over a range of temperature conditions. A base region of the thyristor may be influenced by an electric field of a magnitude that may vary dependent on temperature. This in turn may modify its gain characteristics over a temperature range and may assist its data retention and reliability over the temperature range.

In accordance with another embodiment, a thyristor-based memory may comprise an array of memory cells. A memory cell of the array may comprise a capacitively coupled thyristor and a transistor to selectively access the thyristor. Assisting temperature-stability of the thyristor, a temperature dependent bias may be applied to an electrode that may be capacitively coupled to a base region of the thyristor. This adaptive bias may influence the gain of a bipolar component of the thyristor that might otherwise change with respect to temperature. This compensating influence, in turn, may enhance data retention and/or reliability of the thyristor memory.

In a particular embodiment, the thyristor may be formed in a layer of silicon of an SOI substrate and a temperature-adapted bias source may adjust a voltage level of a supporting substrate of the SOI structure. In a further aspect, the voltage level for the supporting substrate may be controlled based upon a sensed temperature and defined relative to the voltage level of a capacitor electrode of the capacitively coupled thyristor.

In a further embodiment, one of the base regions of the thyristor may comprise a light doping density. The doping may be light enough to establish a component bipolar gain therefor of sensitivity dependent on the relative voltage of the supporting substrate. The other base region of the thyristor and the body regions of MOS devices in the same integrated circuit may be formed with dopant levels substantially greater than that of the first base region and great enough to be substantially insensitive to voltages of the supporting substrate.

In another embodiment, a memory device may comprise a silicon on insulator (SOI) substrate with a capacitively coupled thyristor accessible via an access transistor disposed in a layer of silicon of the SOI substrate. A temperature dependent bias circuit may sense a temperature and adjust a bias of at least one of an electrode of the capacitively coupled thyristor and a supporting substrate of the SOI substrate dependent on the sensed temperature.

In a further embodiment, the thyristor may be formed in the silicon with different doping concentrations between the first and second base regions. The doping concentration of the lighter base region may be sufficiently light so as to impart a sensitivity thereto for its bipolar-type gain dependent on the voltage level of the substrate.

BRIEF DESCRIPTION OF THE DRAWINGS

Subject matter of embodiments of the present invention may be understood by reference to the following detailed description and with reference to the accompanying drawings, in which:

FIG. 1A is a schematic diagram of a thyristor represented with two bipolar transistors as may be useful for gaining an understanding of certain embodiments of the invention.

FIG. 1B is an alternative schematic diagram representing a capacitively coupled thyristor, useful to gain an understanding of embodiments of the invention.

FIG. 2 is a graph illustrating current voltage curves characteristic of a thyristor device at different temperatures, useful for gaining an understanding to certain embodiments of the present invention.

FIG. 9A is a simplified exemplary design template showing a first "error-density versus gain" curve for mapping "Type A" failures at a low-temperature operating condition for a typical thyristor-based memory and a second "error-density versus gain" curve for modeling "Type B" failures at a high-temperature operating condition.

FIG. 9B is a simplified exemplary design template for a thyristor-based memory according to an embodiment of the present invention, showing a first "error-density versus gain" curve for modeling "Type A" failures at a low-temperature operating condition relative to a second "error-density versus gain" curve for modeling "Type B" failures at a high-temperature operating condition and useful to illustrate a target gain design region for offering acceptable yield and/or reliable thyristor-based memory.

DETAILED DESCRIPTION

Figure 3A:
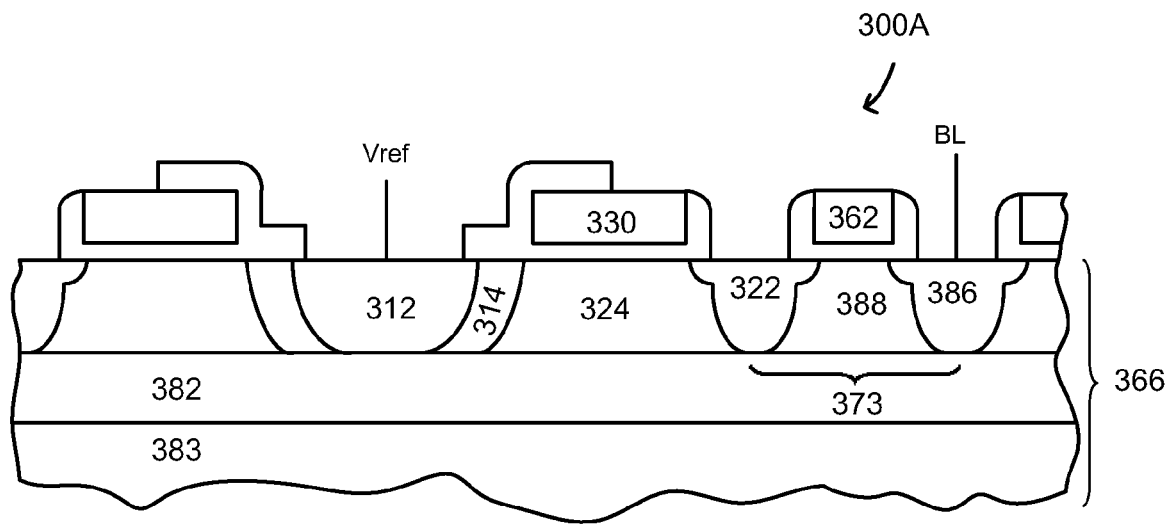
FIG. 3A is a simplified cross-sectional view of a portion of a thyristor-based memory; illustrating an access transistor to access a capacitively coupled thyristor in a silicon on insulator (SOI) realization as may be associated with embodiments of the invention.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor wafer or bulk material. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with the substrate.

Furthermore, those skilled in the art will recognize that although embodiments of the present invention may describe fabrication for a particular sequence of dopant polarities, these dopant type(s) and the doped regions of a substrate may be reversed to form devices of opposite relative conductivity types—e.g., an N-type MOS transistor might be fabricated in such alternative embodiment for opposite conductivity type dopants so as to realize a P-type MOS transistor. Likewise, a thyristor may be described for an embodiment with an order of anode-emitter, N-base, P-base and cathode-emitter, wherein the anode-emitter may be attached, e.g., to a reference voltage and the cathode-emitter may be in common with a source/drain region of an access transistor. It will be understood that for the opposite relative conductivity embodiments, the cathode-emitter might be electrically coupled to a reference voltage and the anode-emitter in common with an access transistor of opposite type channel.

As referenced herein, portions of (e.g., a transistor or thyristor) may be described as being formed in, at or on a semiconductor substrate. Such alternative terms in/at/on may be used individually merely for purposes of convenience. In the context of forming semiconductor devices, such terms may collectively reference portions of a semiconductor element that may be within and/or on a starting structure or material.

Referencing FIG. 1A, a thyristor 100 may be simplistically represented or modeled as comprising an NPN bipolar transistor 101 and a PNP bipolar transistor 102 cross-coupled base-to-collector and collector-to-base. The gain $\beta_{NPN}$ and $\beta_{PNP}$ associated with these transistors may influence the operating characteristics of the thyristor. When applying a voltage to the anode, the thyristor may initially resist current flow within its non-conductive state, as represented by the thyristor's I-V characteristic curve 200 (FIG. 2) between its zero-state bias 202 and bias 204 for an applied voltage less than the a blocking threshold voltage $V_{FB}$. Upon exceeding a blocking threshold voltage $V_{FB}$, the thyristor may abruptly transition to a conductive region as represented by point 208 for a one-state condition.

Further referencing FIG. 1B, a thyristor for a memory application, for example, may incorporate electrode 130 capacitively coupled to a base region of the thyristor. By applying voltage modulation to electrode 130, certain thyristor operations may be performed more reliably or rapidly. Other parameters of the thyristor can also impact its operating characteristics. Some of these parameters may include the doping levels of the anode-emitter, n-base, p-base and cathode-emitter regions in addition to their thickness, width and length, etc.

Relative to thickness, referencing FIG. 3A, capacitively-coupled thyristor 312,314,324,322 may be formed a serial arrangement with access transistor 373 in a thin layer of silicon of an SOI substrate 366. The thyristor and transistor together may define, at least in part, a portion of a thyristor based memory 300A. If sufficiently thin, base region 324 of the thyristor may be fully depleted by appropriate bias of capacitor electrode 330. For example, when transitioning the thyristor from a conducting state 208 (FIG. 2) to a non-conducting state 202, it may be desirable to bump the voltage of the capacitor electrode 330 in order to assist depletion of residual minority carriers in the base region. Otherwise, a longer duration might be required for transitioning the memory element from conducting to a non-conducting condition, which would depend on the typical recombination or life-time decay(s) for carriers within the base region.

Further referencing FIGS. 2 and 3A, the length and doping provisions of the thyristor regions may also affect the thyristor operation. The blocking threshold voltage $V_{FB}$ for the thyristor and the holding current $I_H$ required for a one-state condition may depend on the gain of the component bipolar devices, which in turn may depend on the length and doping densities of base 324 or 314 and respective emitter regions 322 and 312. The integrated amount of dopant provided for a base region along the base length relative to the integrated amount of dopant provided for an emitter region along the emitter length thereof may be used to estimate the gain to a bipolar device. Accordingly, designs for establishing a given gain to a bipolar device may target a certain ratio between the integrated base doping and the integrated emitter doping (known as the base and emitter Gummel numbers, respectively) and may be guided by principles of known Gummel number relationships and equations available from bipolar transistor theory. In general, a device designed with a short base and/or light base doping may achieve a high gain (beta). Likewise, high emitter doping may also contribute to gain.

In the embodiment described relative to FIG. 3A, the thyristor-memory was illustrated in a horizontal construction of an SOI realization. However, it may alternatively be constructed with a vertical structure or mixed vertical/horizontal structure.

Figure 3B:
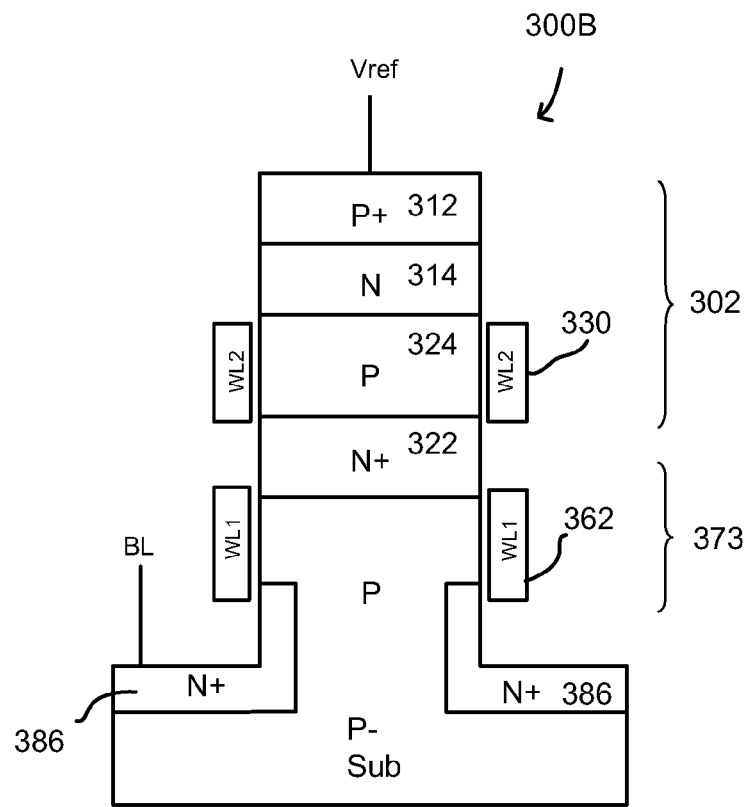
FIG. 3B is a simplified cross-sectional view of a portion of a thyristor-based memory; illustrating a pillar realization of a capacitively coupled thyristor and access transistor as may be associated with certain embodiments of the invention.
Figure 3C:
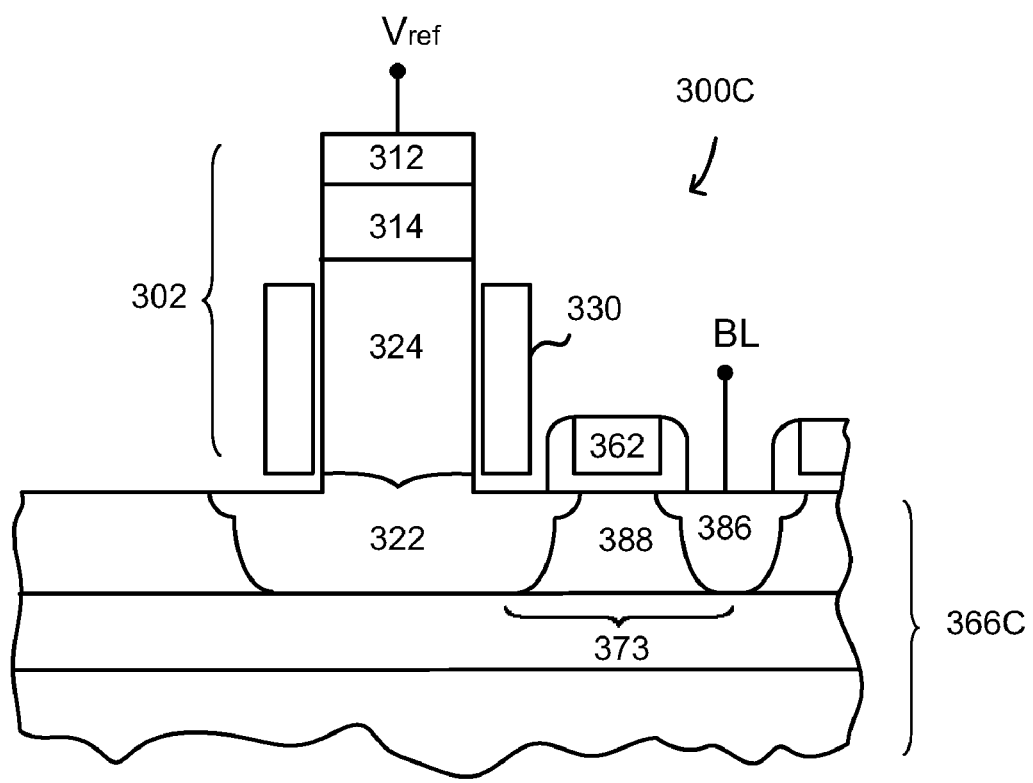
FIG. 3C is a simplified cross-sectional view of a thin capacitively coupled thyristor of another pillar style realization as may be associated with certain embodiments of the invention.

For example, referencing FIGS. 3B and 3C, alternative examples for thyristor configurations of thyristor-based memory devices 300B and 300C may include the pillar or fin structures. In a particular example, the anode-emitter 312, N-base 314, P-base 324 and cathode emitter 322 may be disposed in sequential contiguous relationship within a pillar or fin of semiconductor material that may extend vertically or perpendicularly to a plane defined by a supporting substrate such as an SOI substrate 366C. For the embodiment of FIG. 3B, portions of a body and source/drain to an access transistor may be disposed as a part of the fin/pillar structure in series with the thyristor. In contrast, referencing FIG. 3C, a mixed vertical/horizontal structured thyristor-based memory 300C may comprise an access transistor 373 disposed in a layer of silicon of an SOI substrate. The drain/source region 322 of the access transistor may be in common with the cathode-emitter region for thyristor 302.

Figure 3D:
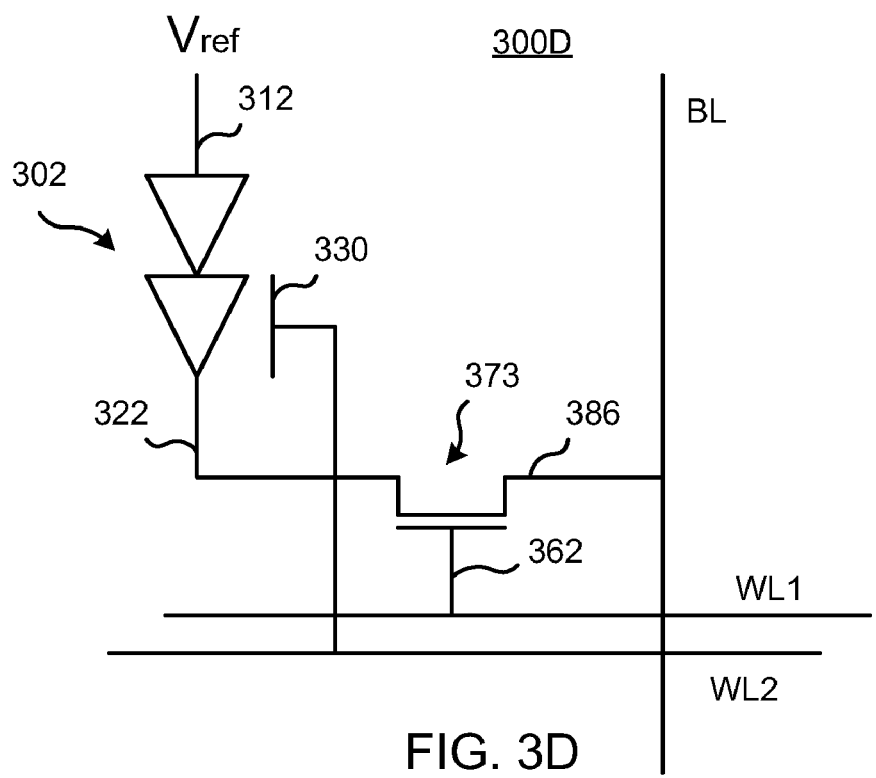
FIG. 3D is a schematic representation of a thyristor-based memory comprising an access transistor to access a capacitively coupled thyristor, as may correspond to a variety of physical structure realization(s).

FIG. 3D shows how these various thyristor-based memory embodiments may be represented schematically. The anode region of thyristor 302 may be coupled to receive the reference voltage $V_{REF}$ and the cathode-emitter region 322 coupled electrically to a drain/source of access transistor 373. The source/drain region 386 of the MOSFET may be coupled to bitline BL within, e.g., an expanded memory array (not shown). In this example, gate 362 of the access transistor may be coupled to an access control line of a first wordline WL1, while capacitor electrode 330 (over a base region of thyristor 302) may be coupled to another control line that may be referenced as a second wordline WL2. Accordingly, the thyristor and the access transistor of a thyristor-based memory 300D may form part of an extended memory of understood wordline and bitline array architecture.

When operating thyristor-memory over a range of temperature, the gain of the bipolar devices may increase at higher temperatures and may decrease and low temperatures. At a low operating temperature, the bipolar elements of the thyristor therefore may comprise a reduced gain, which may make it more difficult to turn the thyristor on.

Alternatively, at higher operating temperatures, the bipolar components of the thyristor may exhibit increased gain, which may make it difficult to write or maintain an off state condition. Again, referencing FIG. 2, the increased gain at the high operating temperature may reduce the blocking voltage $V_{FB}(TH)$ threshold of the bias point 206B for transitioning the thyristor from an off-state to a conductive condition. This may be viewed as a vulnerability of the thyristor device to noise. Thus, the high temperature may increase the gain of the bipolar components such that it may be more susceptible toggling from a zero state to a one state under the influence of noise.

Referencing FIG. 9A, a design template 900A may be used to assist selection of a target gain in the fabrication of a thyristor memory device. The gain for the component bipolar device of a thyristor may be selected based upon modeled error probabilities therefore at given temperatures of operation. A first curve 904A of a design selection template 900A may characterize an error density or error probability of a thyristor device for a certain type of failure (called "Type A") at a low operating temperature, such as 0° C. It may be observed that by selecting a sufficiently high target gain for the component bipolar devices of the thyristor, a low "Type A" failure rate may be readily achieved. On the other hand, maintaining a low error probability for another type of failure (Called "Type B") when operating the typical device at high temperatures, per the density curve 906A, may suggest a design of low gain.

Accordingly, a compromise may exist between a desire for a low gain design at high temperature operation and the opposing desire for a design of high gain that may preserve performance at low temperature operation. In some instances, a method of fabrication for a thyristor device may target a narrow region for specified gain ($\beta_T$) that may be able to yield devices of typical embodiments potentially operable over a range of operating temperatures. Compounding the problem, however, may be variances in processing steps associated with the fabrication of semiconductor devices. These variances may have the effect of sliding actual gain realization away from a targeted gain e.g., ($\beta_T$ of FIG. 9A) so as to potentially result in excessive error probabilities and low production yield for typical thyristor-based memory devices.

Figure 4:
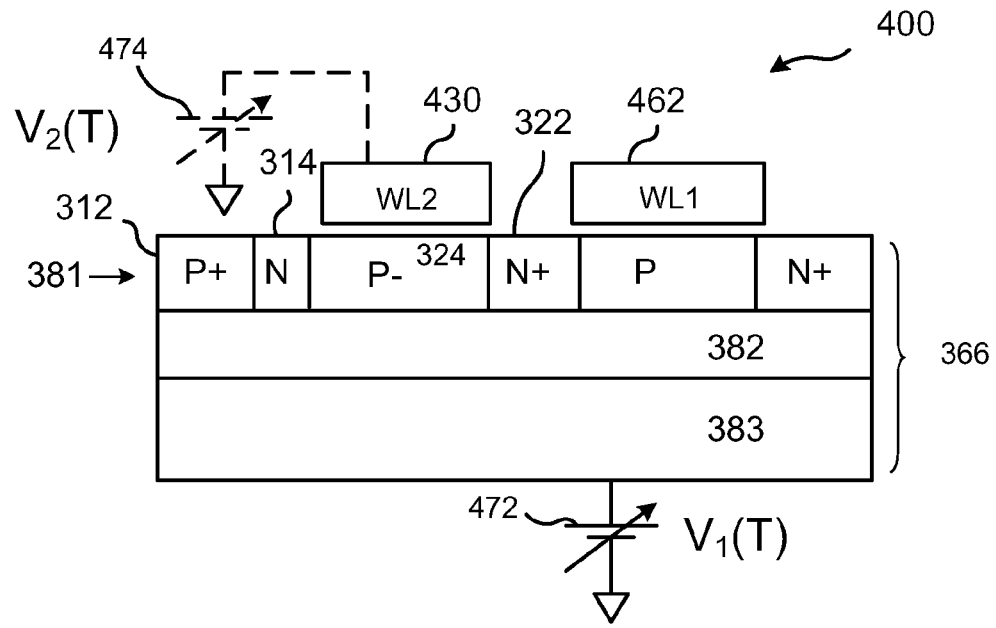
FIG. 4 is a simplified cross-sectional view of a portion of a thyristor-based memory, according to an embodiment of the present invention, illustrating a supporting substrate of an SOI structure receiving an adaptive bias.

Referencing FIG. 4, in accordance with an embodiment of the present invention, a thyristor-based memory 400 may comprise a thyristor and access transistor that may be formed in a layer of silicon disposed of over buried oxide 382 and over supporting substrate 383 of a silicon insulator SOI substrate structure 366. In a particular embodiment, the buried oxide 382 may comprise a thickness of about 1000 to 5000 angstroms. The layer of silicon 382 may comprise thickness less than about 10,000 angstroms. For this embodiment, doping levels of P-base 324 may be sufficiently light so as to enable adaptive voltage source 472, applied to supporting substrate 383, an ability to modulate a bipolar gain of an NPN transistor of the thyristor. Supporting substrate 383 may receive a voltage level of the adaptive voltage source 472 that changes with respect to temperature for changing the gain of the component bipolar device of the thyristors. In accordance with further embodiments, electrode 433 disposed over and capacitively coupled to the base region might also receive bias from a temperature dependent voltage source 474. With a sufficiently light doping of P-base 324, and a sufficiently thin layer of oxide 382, the gain ($\beta_{NPN}$) of the bipolar device associated with the thyristor may be modulated with a voltage range as low as 0 to ±5 volts, or as low as 0 to ±3 volts. In other embodiments, the voltage range may be between −1 and +1 volts, or other range.

With a light doping for P-base 324, it may be more susceptible to dopant profile modulation via the voltage adjustments to the supporting substrate. In other words, a given change in voltage of adaptive source 472 may influence a given thickness of P-base 324 which will depend upon the amount of charge available therein. With low density concentrations of dopant within the P-base 324, the voltage changes of the supporting substrate may impact a greater portion or thickness of P-base 324 for displacement of a given amount of charge toward or away from the supporting substrate. This displacement may impact the gain of the associated NPN transistor. By modulating the voltage of supporting substrate 383, it may change the depth at which the majority of current flows within the P-base 324. In terms of Gummel numbers, the gain may thus be understood to depend on the ratio of the integrated emitter doping and the integrated base doping. Simplistically viewed, a calculation for the base Gummel number in a real three-dimensional structure may be thought of as being performed along the path where the integrated majority carriers may effect the smallest value. That is, if we integrate from the left side to the right side of base region 324. The integral path may traverse the dopant profile's contour location where the majority carriers are of lowest density. By having a sufficiently light doping profile with the P-base 324, the voltage modulation of substrate 383 may adjust the carrier distribution within the base region so as to more readily impact the resulting gain of the bipolar device with a given voltage and/or electric field influence.

In a further embodiment, again referencing FIG. 4, the P-base region may be doped sufficiently light and the buried oxide sufficiently thin (e.g., less than 5000 angstroms) to allow modulation of the gain of the NPN device with a nominal voltage variation of adaptive voltage source 472, e.g., from between 0 to ±3 volts. Further, N-base 314 may comprise dopant concentration much greater than that of the P-base so as to remain sufficiently unaffected by the changes in voltage level source of 472. Accordingly, while the changes in level of the adaptive voltage source 472 may adjust the gain of the NPN bipolar device via the carrier redistribution in P-base 324, the gain of the PNP bipolar device may remain substantially the same.

In a particular embodiment, adaptive voltage source 472 may comprise a temperature sensing circuit and a voltage generator disposed external the integrated packaging of thyristor-based memory 400. For example, an external temperature sensor may sense a temperature and cause the generator to source a voltage dependant upon the temperature sensed. The adaptive voltage source may then be coupled to a pin of the package associated with the thyristor memory. The pin may be electrically coupled to the supporting substrate 383 to propagate the adaptive voltage thereto.

Figure 5:
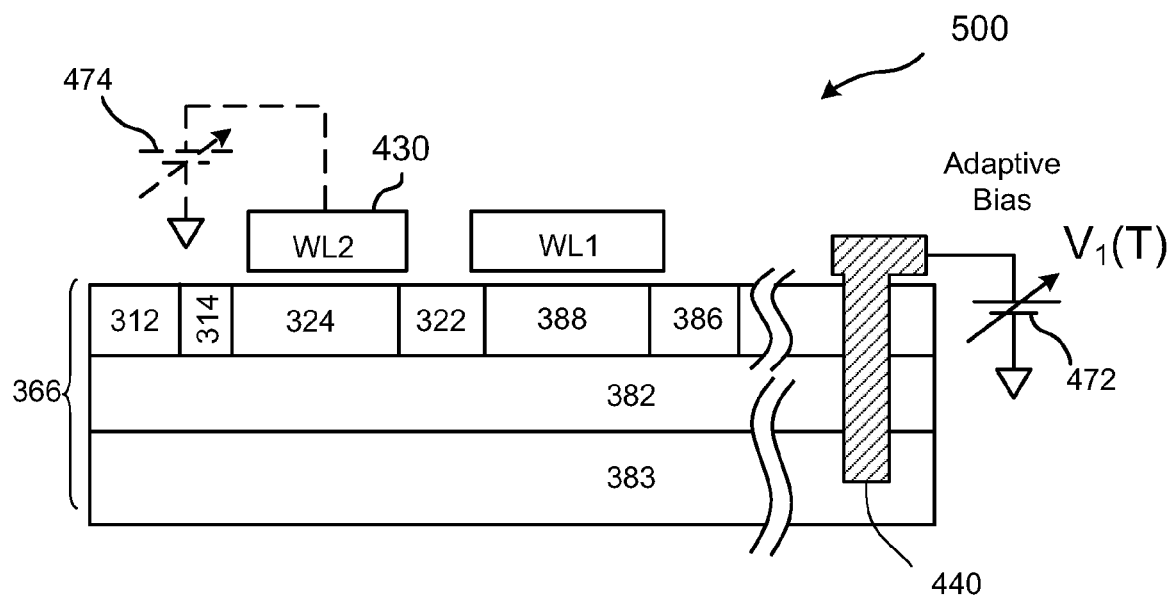
FIG. 5 is a simplified cross-sectional view of a portion of a thyristor-based memory, according to an embodiment of the present invention, illustrating means for coupling a supporting substrate of an SOI structure to an adaptive bias.

In an alternative embodiment, referencing FIG. 5, a conductive line may route the bias of adaptive voltage source 472 to select interfacing regions over the SOI substrate. These select interfacing regions may connect to via 440 that may electrically interface supporting substrate 383. It will be understood that known insulating provisions (oxide, nitride or other insulators) may be disposed about via 440 and may keep it insulated relative to active regions of the layer of silicon. Additionally, adaptive voltage source 472 may be integrated internal to the thyristor-based memory 500. The resulting memory device, thus, may be described as self-contained and/or internally compensated for adjusting the gain of a bipolar device of respective thyristors based upon temperature.

Figure 6:
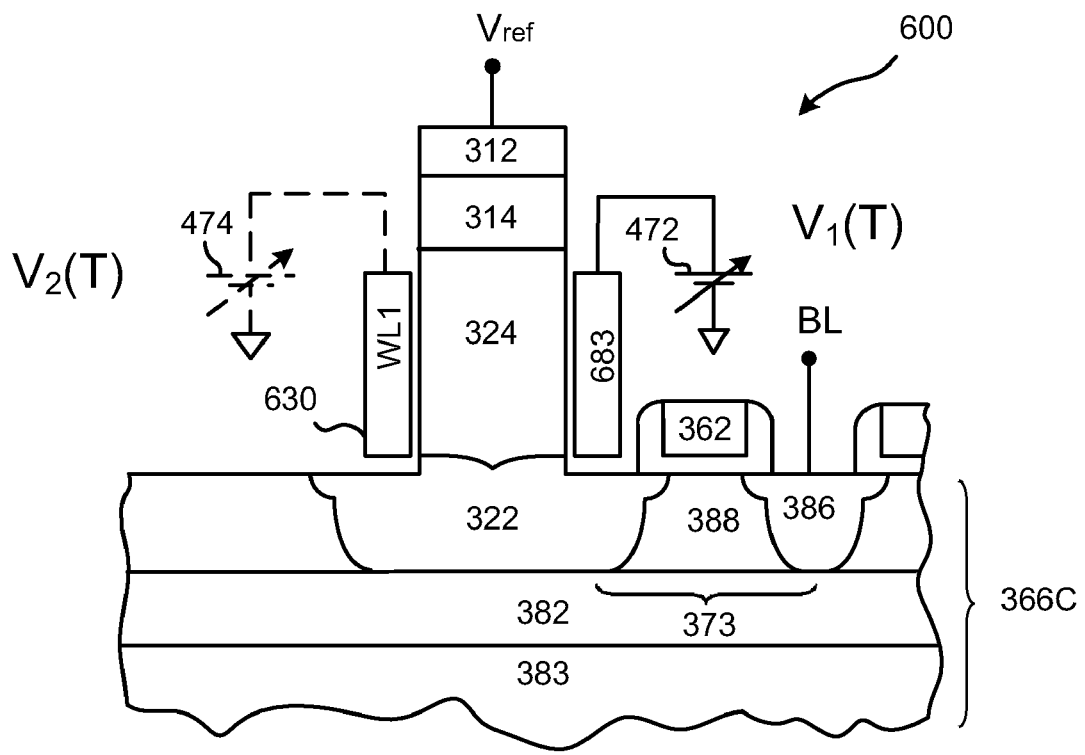
FIG. 6 is a simplified cross-sectional view of a portion of a thyristor-based memory, according to an embodiment of the present invention, illustrating a bias of temperature dependence coupled to an electrode of a capacitively-coupled thyristor of a pillar structure.

Referencing FIG. 6, in addition to backside adaptive bias for horizontally oriented thyristors, vertically oriented thyristors for further embodiments of thyristor-based memory 600 may also receive bias of an adaptive voltage source 472. Such bias may be applied to the backside of base region 324 of thyristor-based memory 600. The term "backside" may be used in this context for describing a placement relative to a wordline electrode 630. Again, the level of the adaptive voltage source 472 may vary with respect to temperature and may alter or distribute the carrier distribution within base region 324 to influence the gain of the thyristor device based upon temperature.

In a further embodiment of the present invention, the adaptive voltage source may be applied to both left and right electrodes 630, 683 and may distribute the carrier concentrations to affect the gain. For example, positive potentials may be applied to both the left and right electrodes about P-base region 324. The influence of these potentials may concentrate the majority carriers in the middle region of the base while areas adjacent the electrodes may comprise substantially reduced density of the majority carriers. Therefore, there may be control as to where the current may flow and how much, which may be viewed to affect the gain of the component bipolar device associated with the thyristor.

Figure 7A:
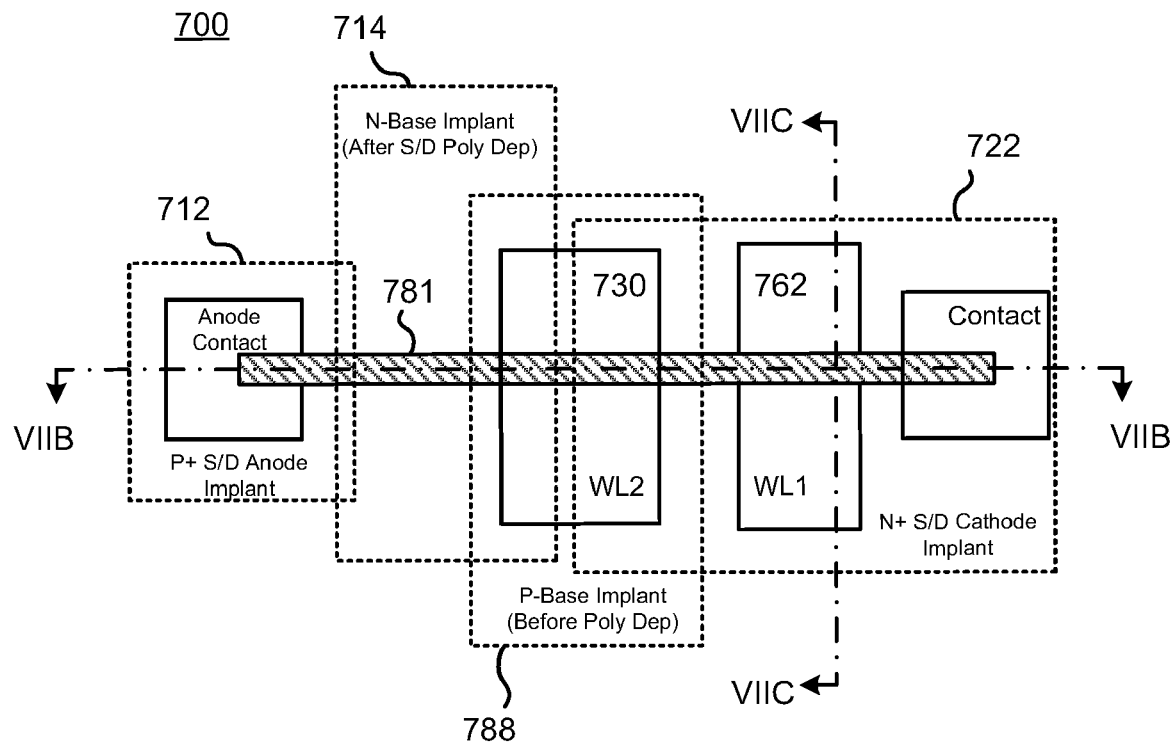
FIGS. 7A-7C are simplified planar and cross-sectional views for different portions of a thyristor-based memory according to an embodiment of the present invention, illustrating a fin structured configuration and a bias of temperature dependence coupled to an electrode over/beneath a base of the capacitively-coupled thyristor.
Figure 7B:
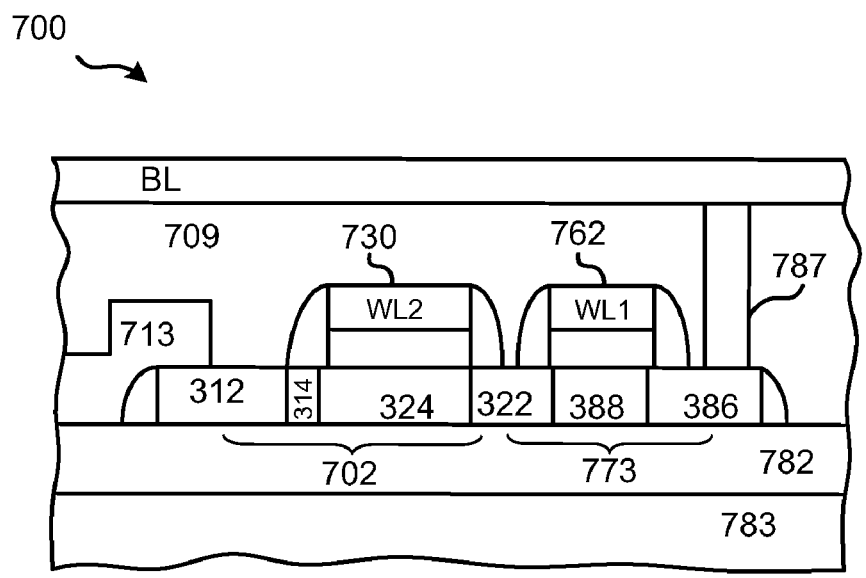
Figure 7C:
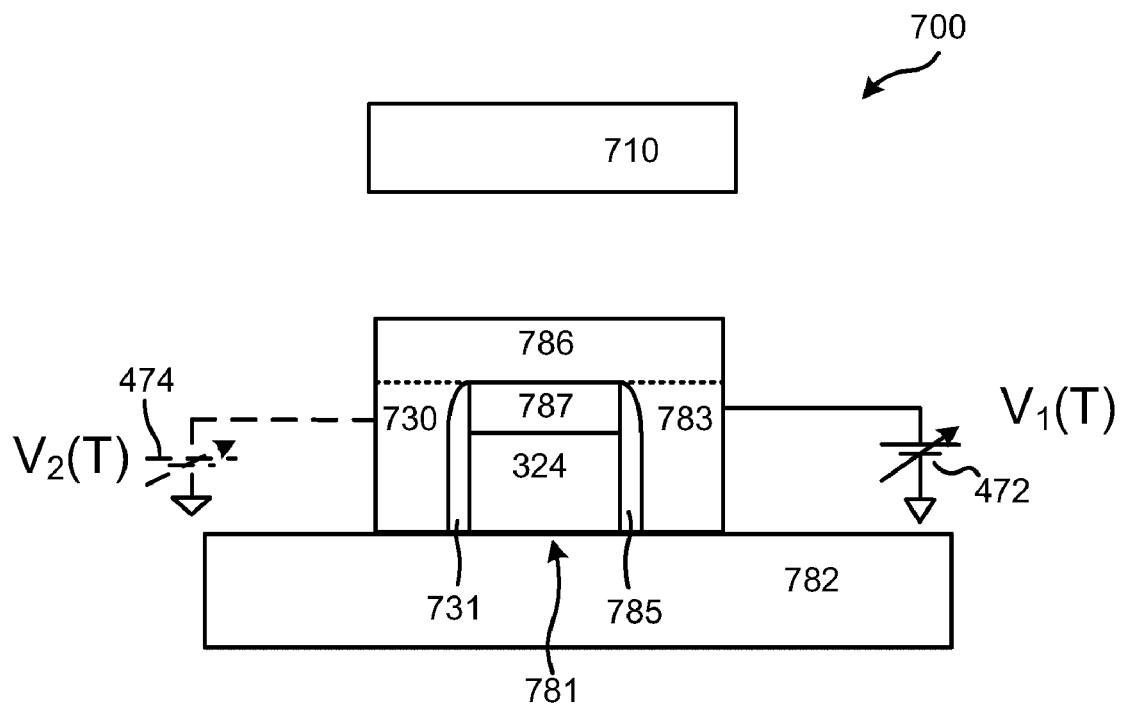

Referencing FIGS. 7A-7C, a thyristor-based memory 700 per an example of a FIN configured embodiment may be formed at least in part within a sliver or fin of silicon 781 disposed over insulator 782. In one example, insulator 782 may comprise an insulating layer (e.g., or BOX) over a supporting substrate 783 (FIG. 7B).

Further referencing FIGS. 7A-7C, portions of silicon fin 781 may be implanted (via different dopant and respective implant apertures 712, 714, 788, 722) to form respective regions of thyristor 702 and access transistor 773. Referencing the longitudinal cross-section of FIG. 7B, thyristor 702 may comprise anode-emitter 312, N-base 314, P-base 324 and cathode-emitter 322. The access transistor 773 may comprise source and drain regions 386, 322 about body region 388. Anode-emitter 312 of thyristor 702 may be coupled to conductive material 713 to receive anode voltage signal ($V_{REF}$). Source/drain 386 of access transistor 773 may be electrically coupled to bitline 710 by way of bitline contact or via 787. Known interlayer dielectric 709 (e.g., BPSG, Spin-on-glass, dielectric, etc.) may support conductive lines such as bitline 710) over the thyristor memory device 773, 702. Additional information for the structure and fabrication of such fin-type thyristor memory may be found in U.S. application Ser. No. 10/238,572, hereby incorporated by reference in its entirety.

Referencing FIG. 7B and the simplistic cross-sectional of FIG. 7C, base region 324 (e.g., P-base) of thyristor 773 may comprise dimensions that correspond to the cross-sectional dimensions of fin 781. In some examples, fin 781 may comprise a height greater than its cross-sectional width between the sidewall electrodes. For example, fin 781 may comprise a height greater than 1,800 angstroms and a width less than 1,500 angstroms. In a particular example, it may comprise a height greater than 1,800 angstroms and a width of about 1,000 angstroms.

Further referencing FIG. 7C, thin dielectrics 731, 785 may insulate electrodes 730, 783 respectively about opposite sidewalls of base region 324. The dielectrics 731, 785 may define per their thickness and dielectric-constant the capacitive couplings of respective electrodes 730 and 783 to base region 324.

In one embodiment, the electrodes 730, 783 may be electrically isolated from each other. In such embodiment, an upper portion 786 of conductive material that may be associated with an initial step in the formation of the electrode (WL1) over the base region may be removed. In some methods, for example, it may be removed using a planarization procedure such as chemical mechanical planarization (CMP). Dielectric cap 787 (e.g., oxide, nitride, glass, etc.) may comprise a thickness substantially greater than the thickness of the sidewall dielectrics 731, 785. With a sufficient thickness, dielectric cap 787 may protect fin 787 during the removal of the upper portion of conductive material 786, e.g., by CMP planarization.

In an embodiment of the present invention, electrode 730 may propagate a wordline control signal to assist writing/reading of the thyristor cell during access of the thyristor memory. Electrode 783 may, in some applications, serve as a "backside" electrode and receive a bias of a temperature dependent, adaptive voltage source 472. The bias of this source may change with respect to temperature, which in turn may influence the gain of the bipolar component of the thyristor.

In further embodiments, both electrodes 730, 785 may receive the bias of adaptive voltage source 472. As the bias changes with temperature, it may distribute carriers within base region 324 (e.g., to a central region of the fin) and may stabilize the gain of the bipolar component of the thyristor across a temperature range.

Figure 8A:
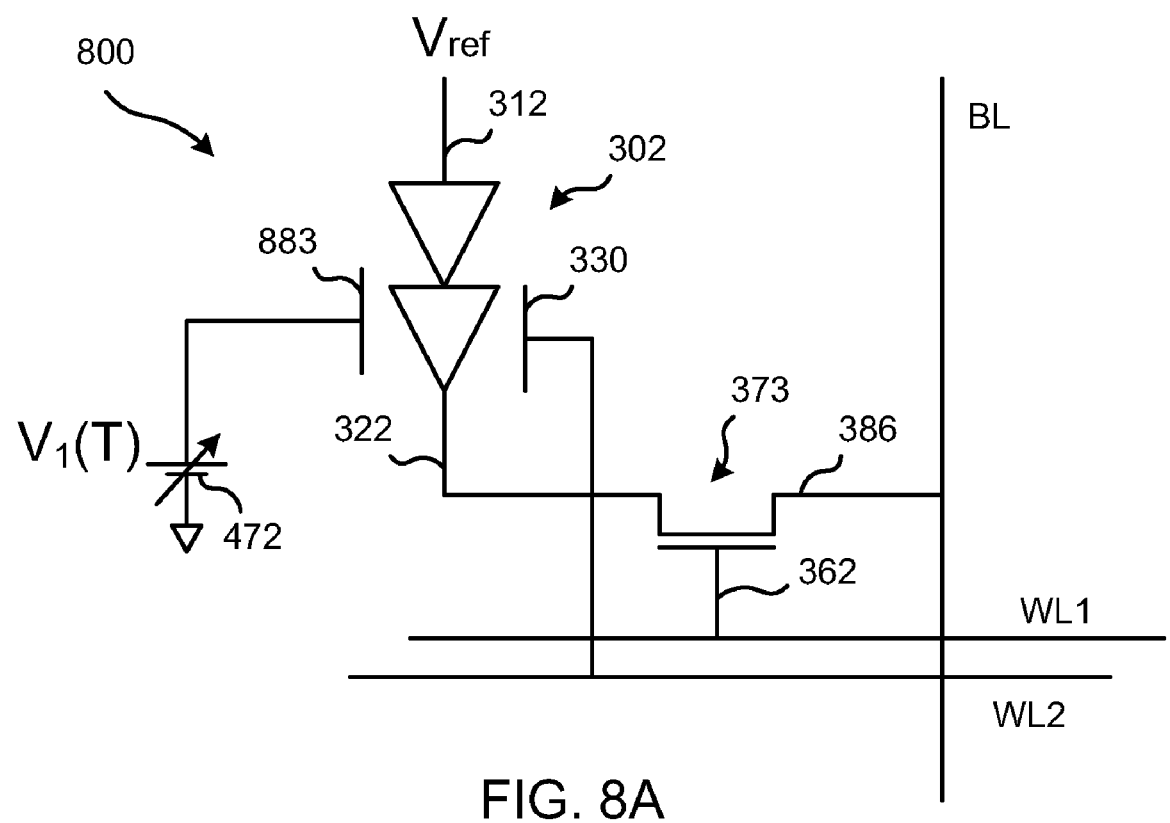
FIG. 8A is a schematic diagram of a thyristor-based memory, according to an embodiment of the present invention, showing a temperature adapting bias coupled to an electrode that is capacitively coupled to a region of the thyristor.
Figure 8B:
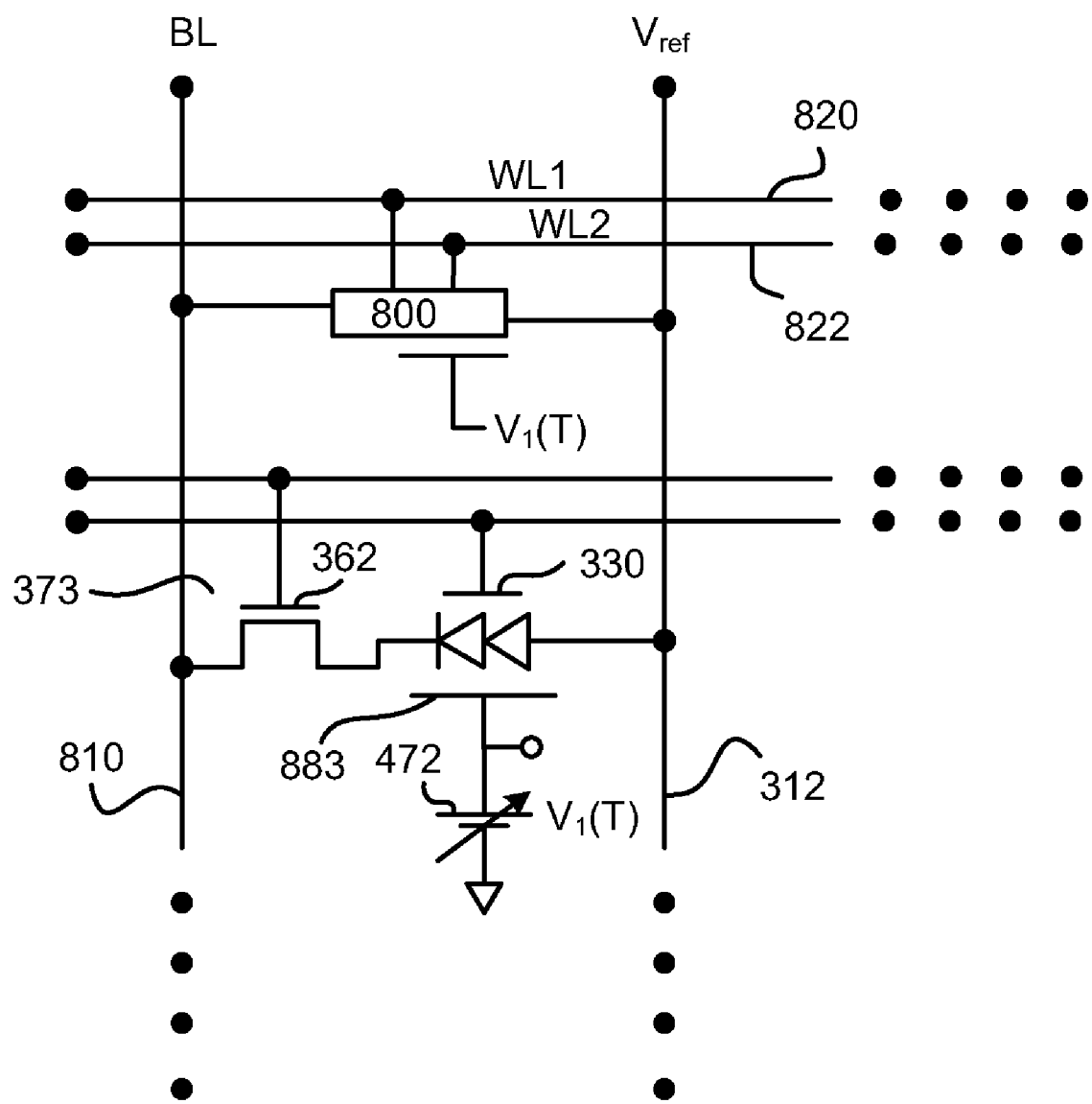
FIG. 8B is a schematic diagram of a portion of the thyristor-based memory, according to an embodiment of the present invention, showing capacitively-coupled thyristors of the device with temperature adjusting biases.

Reference FIGS. 8A and 8B, a semi-conductor memory device 802 may comprise a plurality of thyristor-based memory 800, which may be disposed collectively as an array of rows and columns. The cells 800 may comprise thyristor-based elements corresponding to embodiments disclosed previously herein relative to FIGS. 4-7. Bitlines 810 within the array may be coupled to source/drain regions 386 of access transistors 373. Gates 362 of respective access transistors 373 may be coupled to associate access wordlines 820 (WL1). Electrodes 330 of respective thyristor devices 302 may be coupled to respective second wordline (WL2) 882 within the array of semiconductor device 802. By appropriate control of these wordlines, the contents of the various thyristor cells 800 may be selectively accessed for reading or writing data via the bitlines 810.

To assist the stability and reliability of the memory cells of the memory array 802 relative to temperature, adaptive bias source 472 may provide a voltage that varies with respect to temperature and may be coupled capacitively to the respective base regions of the thyristor memory cells across the array. The voltage change with respect to temperature may serve to stabilize operability for the memory over a broad range of temperatures.

Figure 10:
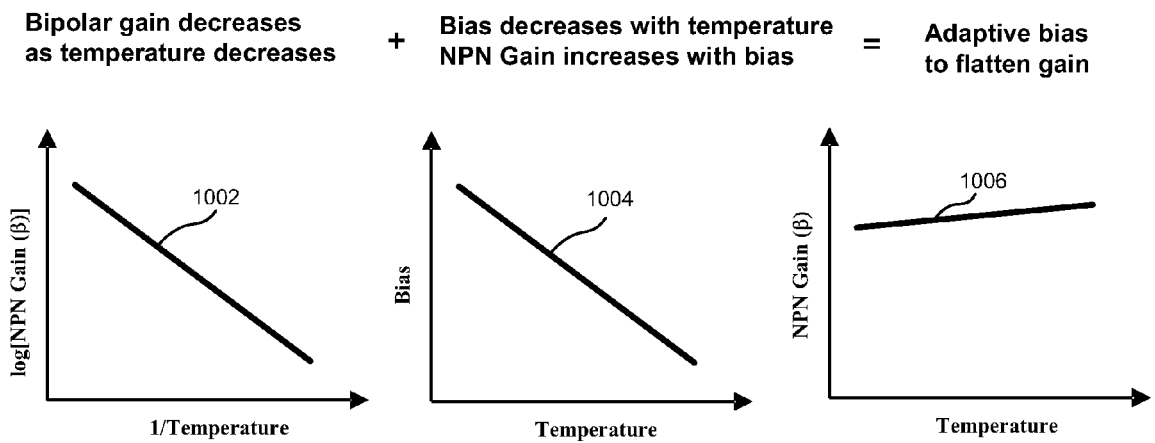
FIG. 10 is a simplified graphical model to portray a compensated "flat gain vs. temperature" bipolar property of a thyristor memory as a super-positioned combination of the "bipolar gain versus temperature" characteristic and a "temperature adapted control bias", as may be useful to gain an understanding of characteristics for certain embodiments of the present invention.

As represented in FIG. 8, the adaptive voltage source 472 may be applied to the base regions of the various thyristors across an entirety of the memory array 802. In this manner, each of the devices may be influenced (with adaptive gain adjustment) for compensating operative effects based on temperature variations. Such operative affects and compensation thereof may be characterized with reference to the graphical illustrations in FIG. 10. Curve 1002 represents a bipolar gain comprising a decreasing gain with decreasing temperature. As shown by adaptive bias curve 1004, an adaptive bias voltage may decrease with temperature, which may be capacitively coupled to a base region to compensate the bipolar gain. The resulting compensated gain 1006 might thus appear flat and more stable across a given temperature range. Accordingly, the adaptive bias may be described as compensating the inherent gain sensitivity to temperature for achieving more stable and reliable memory operation across temperature ranges.

One of the benefits for the adaptive biased thyristor-based memory, in accordance with embodiments of the present invention, may be represented by the opening of a larger design window 902 for target gains available for section within the design template 900 as illustrated in FIG. 9B. The greater range of operable gains for the fabrication of thyristor devices per embodiments of the present invention may be apparent by comparing window 902 of the design template 900B of FIG. 9B relative to the target gain $\beta_T$ of template 900A of FIG. 9A. The opening of the design window may also be understood to ease the process controls that may be required during fabrication of the thyristor-based memories. It may also assist product yield and result in product of more acceptable performance and reliability.

Further referencing FIGS. 8-9, during operation of the thyristor memory embodiments at low temperature conditions, the voltage applied by an adaptive voltage source 424 may increase the gain of the PNP bipolar device and, therefore, decrease the holding current as may be necessary to main the state of the thyristor in a one-state condition. Referencing FIG. 9B relative to FIG. 9A, this influence may be characterized as shifting the one-data failure curve 904 at 0° C. to the left so as to establish lower defect probabilities at a given selection of bipolar gain.

In a particular example, adaptive bias source 472 may apply a negative DC voltage to the supporting substrate or electrode that is in insulated capacitively-coupled relationship to the backside of the base region of the thyristor so as to increase the injection of carriers from the emitter region of the thyristor to the P-base region.

In contrast, during high temperature operation, the voltage bias of the supporting substrate capacitively-coupled to the backside of the base region may serve to decrease the bipolar gain of the thyristor and increase the effective forward blocking voltage of the thyristor. Accordingly, the probability for "Type B" failure may be reduced. This may be viewed or understood to be equivalent to shifting the "Type B" failure curve 906 at 125° C. to the right for the effective design template 900B for embodiments of the present invention.

In further embodiments of the present invention, the adaptive voltage source 472 may supply a voltage level that shifts non-linearly with respect to temperature. For example, it may require determination of a first threshold temperature before adjusting it's output voltage from a high or low level. Similarly, it may shift its voltage level in a step-like fashion across a plurality of different first, second, third . . . temperature thresholds. Further, by performing a variety of tests associated with different semi-conductor devices, the adaptive voltage characteristics desired for a variety of different temperatures may be obtained and used to adjust the voltage source 472 for controlling the bipolar gains. In a further embodiment, the threshold temperatures might be pre-programmed within a controller or read-only memory and used for adjusting the voltage to be applied to the substrate or electrodes that are capacity coupled to the backside of a base region of the respective thyristors of the thyristor memory.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of P-N sections in the thyristor device; and interchanging P and N regions in the device structures and/or using P-MOSFETS rather than N-MOSFETS. Such modifications and changes do not depart from the true spirit and scope of the present invention that may be set forth in the following claims.

What is claimed is:

1. A semiconductor memory comprising:
an access transistor comprising a gateable channel;
a capacitively-coupled thyristor memory cell accessible via the access transistor;
the capacitively-coupled thyristor memory cell comprising a gate electrode disposed over a base region of the thyristor; and
a temperature sensing circuit to sense temperature and coupled to affect a voltage of the gate electrode based on the temperature sensed;
wherein the capacitively-coupled thyristor memory cell is formed in a silicon layer of a silicon-on-insulator ("SOI") substrate structure; and
wherein the temperature sensing circuit is coupled to define a voltage level of the capacitor electrode relative to that of a support substrate of the SOI substrate structure located below the silicon layer.

2. A circuit comprising:
a plurality of memory cells; and
at least one memory cell of the plurality of memory cells comprising:
a thyristor having an anode emitter region, an N-base region, a P-base region;
a gate electrode disposed over one of the N-base region and the P-base region; and
a variable source coupled to bias the gate electrode with a voltage level;
wherein the bias provided by the variable source changes responsive to changes in temperature; and
wherein the variable source biases the gate electrode with the voltage level which is further responsive to voltage of a support body of the thyristor.

3. The circuit of claim 2, further comprising another variable source coupled to bias the support body responsive to changes in temperature.

4. A circuit comprising:
a plurality of memory cells; and
at least one memory cell of the plurality of memory cells comprising:
a thyristor having an anode emitter region, an N-base region, a P-base region, and a cathode-emitter region;
a gate electrode disposed over one of the N-base region and the P-base region; and
a variable source coupled to bias the gate electrode with a voltage level;
wherein the bias provided by the variable source changes responsive to changes in temperature; and
wherein the variable source is configured to change the voltage level of the gate electrode relative to voltage of a supporting substrate located beneath the thyristor.

5. A circuit comprising:
a plurality of memory cells; and
at least one memory cell of the plurality of memory cells comprising:
a thyristor having an anode emitter region, an N-base region, a P-base region, and a cathode-emitter region;
a gate electrode disposed over one of the N-base region and the P-base region; and
a variable source coupled to bias the gate electrode with a voltage level;
wherein the bias provided by the variable source changes responsive to changes in temperature;
wherein the thyristor comprises a bipolar transistor;
wherein the bipolar transistor comprises an intrinsic gain-versus-temperature interdependency associated with a positive/negative co-efficient; and
wherein the bias varies with the temperature to influence gain of the bipolar transistor for a negative/positive interrelationship co-efficient component that is opposite the intrinsic gain-versus-temperature interdependency.

* * * * *